United States Patent
Stuckey et al.

(10) Patent No.: US 12,202,129 B2
(45) Date of Patent: *Jan. 21, 2025

(54) TOOL-LESS PICK TIP ASSEMBLY, HOUSING, AND APPARATUS, AND ASSOCIATED METHOD

(71) Applicant: Boston Semi Equipment LLC, Billerica, MA (US)

(72) Inventors: Larry Stuckey, Billerica, MA (US); John Murach, Billerica, MA (US); John Lewis, Billerica, MA (US); Kent Blumenshine, Billerica, MA (US); Jason Chalfant, Billerica, MA (US); Colin Scholefield, Billerica, MA (US)

(73) Assignee: Boston Semi Equipment LLC, Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/496,827

(22) Filed: Oct. 27, 2023

(65) Prior Publication Data

US 2024/0058972 A1    Feb. 22, 2024

Related U.S. Application Data

(63) Continuation of application No. 17/418,649, filed as application No. PCT/US2019/068821 on Dec. 27, 2019, now Pat. No. 11,833,670.

(Continued)

(51) Int. Cl.
*B25J 15/06* (2006.01)
*B25J 15/04* (2006.01)

(52) U.S. Cl.
CPC ......... *B25J 15/0683* (2013.01); *B25J 15/04* (2013.01); *B25J 15/0441* (2013.01)

(58) Field of Classification Search
CPC .... B25J 15/0616; B25J 15/0683; B25J 15/04; B25J 15/0441

(Continued)

(56) References Cited

U.S. PATENT DOCUMENTS 3,720,433 A * 3/1973 Rosfelder ............. B66C 1/0243
294/188
6,394,519 B1    5/2002 Byers
(Continued)

FOREIGN PATENT DOCUMENTS

WO    2014040843 A1    3/2014

OTHER PUBLICATIONS

International Search Report and Written Opinion in International Application No. PCT/US2019/068821, mailed Mar. 24, 2020 (9 pages).

*Primary Examiner* — Dean J Kramer
(74) *Attorney, Agent, or Firm* — Nixon Peabody LLP (57) ABSTRACT

Disclosed are a pick tip apparatus method interchanging pick tip assemblies within the same. The pick tip apparatus includes a housing having a housing channel. The apparatus further includes a fitting connected to the housing channel. The fitting is configured to accept an external vacuum source for applying a vacuum to the housing channel. The apparatus further includes a magnet and a pick tip assembly. The pick tip assembly is releasably held within the housing channel magnetically by the magnet. The pick tip assembly includes a vacuum cup and a pick tip body. The pick tip body has a pick tip body channel in communication with the housing channel and configured to apply the vacuum from the housing channel to the vacuum cup.

13 Claims, 8 Drawing Sheets

Related U.S. Application Data

(60) Provisional application No. 62/785,890, filed on Dec. 28, 2018.

(58) Field of Classification Search
USPC .......................................................... 294/183
See application file for complete search history.

(56) References Cited

U.S. PATENT DOCUMENTS

| | | |
|---|---|---|
| 6,820,325 B2 | 11/2004 | Gieskes |
| 9,974,235 B2 | 5/2018 | Van De Vegte |
| 11,833,670 B2 * | 12/2023 | Stuckey .................. H01L 21/00 |
| 2003/0201304 A1 | 10/2003 | Hartmann |
| 2006/0150404 A1 * | 7/2006 | Van De Ven ...... H05K 13/0409 |
| | | 29/833 |
| 2011/0176900 A1 | 7/2011 | Hsieh |
| 2017/0120454 A1 * | 5/2017 | Ferguson .................. B25J 9/08 |
| 2018/0376631 A1 | 12/2018 | Ziadeh |

\* cited by examiner

TOOL-LESS PICK TIP ASSEMBLY, HOUSING, AND APPARATUS, AND ASSOCIATED METHOD

CROSS-REFERENCE TO RELATED APPLICATIONS

This application is a continuation of U.S. Non-Provisional patent application Ser. No. 17/418,649, filed Jun. 25, 2021, now allowed, which is a U.S. National Stage Entry of International Patent Application No. PCT/US2019/068821, filed Dec. 27, 2019, which claims priority to and the benefit under 35 U.S.C. § 119(e) to U.S. Provisional Patent Application No. 62/785,890, filed on Dec. 28, 2018, the contents of each of which are hereby incorporated by reference herein in their entireties.

FIELD OF THE INVENTION

The present invention relates to pick tip apparatuses with vacuum pick tips.

FIELD OF THE INVENTION

Conventional pickup tips require tools to interchange one pick tip with another pick tip. Tools may also be required to properly align the new pick tip. In addition to requiring tools, barb fittings or other mechanical fittings have also been required to hold the pick tip in place. These approaches have various drawbacks. For example, the approaches take additional time to interchange pick tip assemblies with different vacuum cup sizes. The approaches also do not insure that the new vacuum cup is aligned correctly in the X, Y, and/or Z planes as compared to the vacuum cup on the pick tip that was removed.

Accordingly, there is a need for a tool-less approach for interchanging pick tip assemblies, alone or in combination with a tool-less approach aligning a new pick tip assembly with the alignment of a previous pick tip assembly.

SUMMARY

According to one embodiment, a pick tip apparatus is disclosed. The pick tip apparatus includes a housing having a housing channel. The apparatus further includes a fitting connected to the housing channel. The fitting is configured to accept an external vacuum source for applying a vacuum to the housing channel. The apparatus further includes a magnet and a pick tip assembly. The pick tip assembly is releasably held within the housing channel magnetically by the magnet. The pick tip assembly includes a vacuum cup and a pick tip body. The pick tip body has a pick tip body channel in communication with the housing channel and configured to apply the vacuum from the housing channel to the vacuum cup.

Each one of the following aspects can be combined with the above embodiment, alone or in combination with any one or more of the other following aspects. In one aspect, the magnet can be coupled within the housing by a fastener. For example, the fastener can be an adhesive or a mechanical fastener, such as a set screw. In another aspect, the magnet can be fixed to the pick tip assembly, and the housing can be formed of a ferromagnetic material. According to such an aspect, the magnet can be integral with the pick tip body of the pick tip assembly. According to another aspect, the pick tip body can include one or more radial channels configured to connect the housing channel to the pick tip body channel. According to such an aspect, the pick tip body can include an annular groove, and the one or more radial channels can extend out radially from the pick tip body channel towards the annular groove. In another aspect, the pick tip assembly can include a gasket around a portion of the pick tip body. The gasket can be configured to form an airtight seal with housing when the pick tip assembly is inserted into the housing channel. According to such an aspect, the portion of the pick tip body can include an annular groove, and the gasket can sit at least partially within the annular groove. In another aspect, the pick tip body can include a proximal portion configured to be inserted into the housing and a distal portion configured to extend beyond the housing when the pick tip assembly is inserted into the housing. According to another aspect, the vacuum cup can be coupled to the pick tip body at the distal portion. In such an aspect, the proximal portion of the pick tip body can be ferromagnetic. In such an aspect, only the proximal portion of the pick tip body can be ferromagnetic. In another aspect, the vacuum cup can be configured to be removable from the pick tip body. According to another aspect, the housing can include a first feature, and the pick tip body can include a second feature. The first feature and the second feature can be configured to cooperate when the pick tip assembly is seated within the housing channel to circumferentially align the pick tip assembly within the housing. In another aspect, the pick tip body can include a first beveled surface, and the housing can include a second beveled surface. The first beveled surface and the second beveled surface can be configured to cooperate to form an airtight seal when the pick tip assembly is seated within the housing channel.

According to another embodiment, a method of interchanging a first pick tip assembly held within a housing with a second pick tip assembly is disclosed. The method includes applying a first mechanical force to the first pick tip assembly for overcoming a magnetic attraction holding the first pick tip assembly within a housing channel of the housing. The method further includes removing the first pick tip assembly from the housing channel after overcoming the magnetic attraction. The method further includes inserting the second pick tip assembly into the housing channel. The method further includes releasing a second mechanical force on the second pick tip assembly for allowing the magnetic attraction to hold the second pick tip assembly within the housing channel.

Each one of the following aspects can be combined with the above embodiment, alone or in combination with any one or more of the other following aspects. In one aspect, the first mechanical force further overcomes an interference fit between a first gasket of the first pick tip assembly and the housing channel. The first gasket can be configured to form an airtight seal with housing when the pick tip assembly is inserted into the housing channel. In another aspect, the method further includes applying a third mechanical force to the second pick tip assembly to overcome an interference fit between a second gasket of the second pick tip assembly and the housing channel when inserting the second pick tip assembly into the housing channel. In such an aspect, the magnetic attraction holding the second pick tip assembly within the housing channel can be configured to overcome the interference fit between the second gasket of the second pick tip assembly and the housing channel to fully seat the second pick tip assembly within the housing channel.

The above summary is not intended to represent each embodiment or every aspect of the present disclosure. Rather, the foregoing summary merely provides an example of some of the novel aspects and features set forth herein.

The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

DETAILED DESCRIPTION

The various embodiments are described with reference to the attached figures, where like reference numerals are used throughout the figures to designate similar or equivalent elements. The figures are not drawn to scale, and they are provided merely to illustrate the embodiments of the present invention. It should be understood that numerous specific details, relationships, and methods are set forth to provide a full understanding. One having ordinary skill in the relevant art, however, will readily recognize that the various embodiments can be practiced without one or more of the specific details, or with other methods or structure. In other instances, well-known structures or operations are not shown in detail to avoid obscuring certain aspects of the various embodiments.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1:
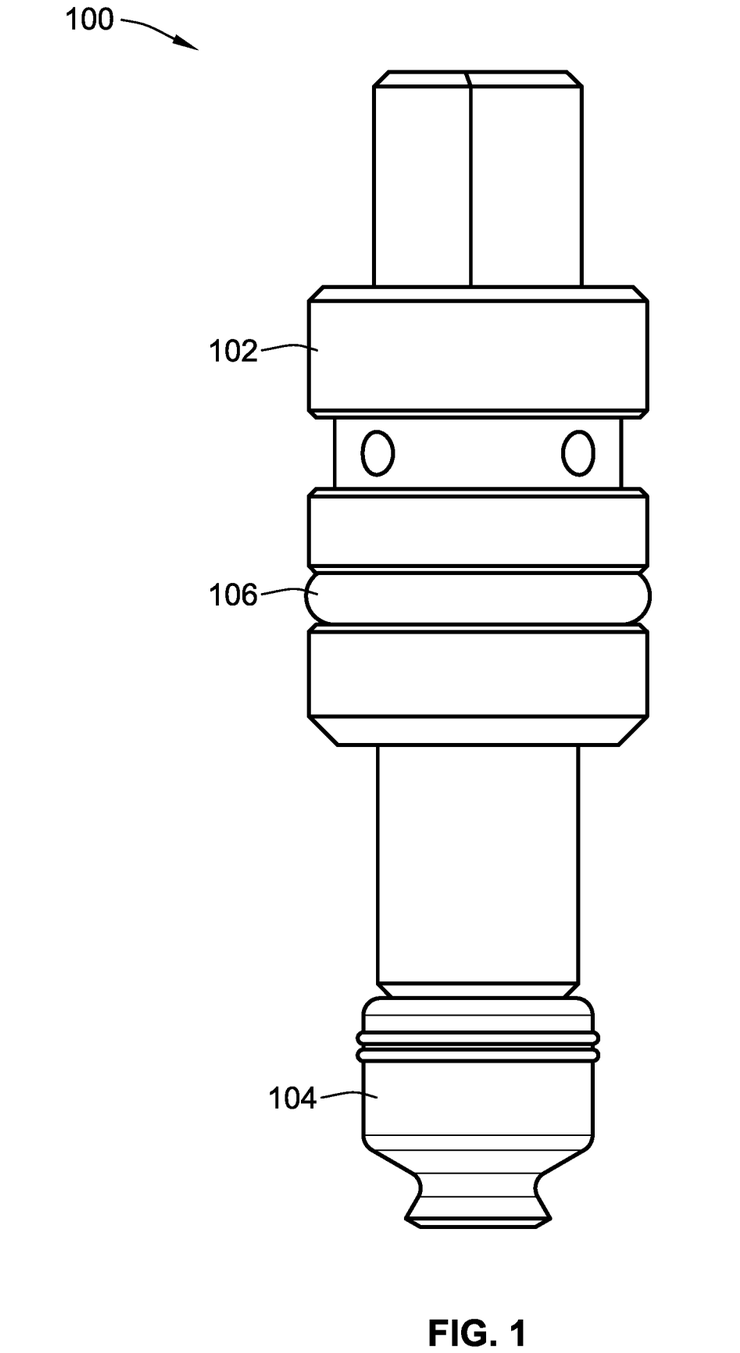
FIG. 1 is a perspective view of a pick tip assembly, according to aspects of the present disclosure.
Figure 2:
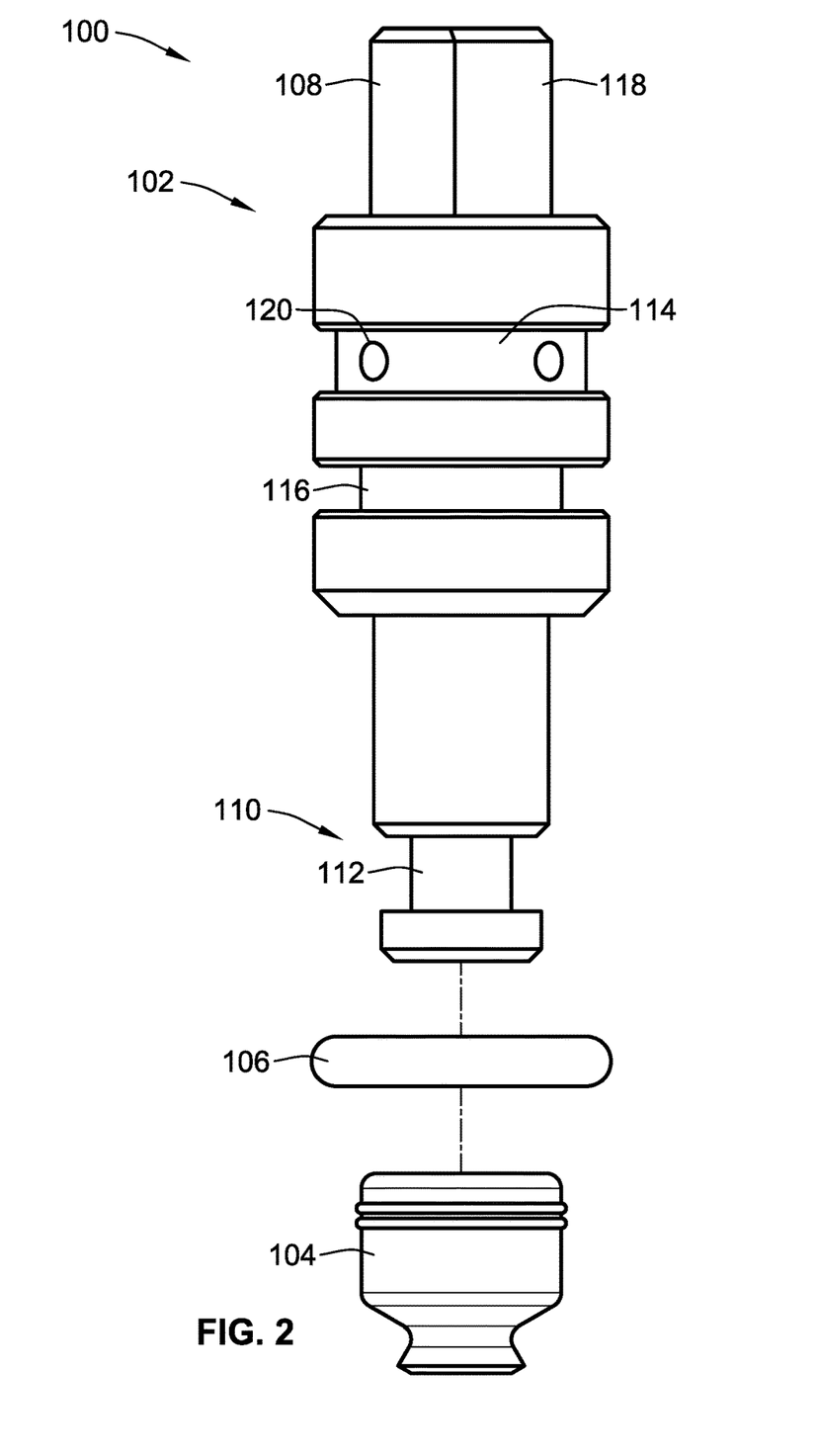
FIG. 2 is an exploded view of the pick tip assembly of FIG. 1, according to aspects of the present disclosure.

FIG. 1 is a perspective view, and FIG. 2 is an exploded view, of a pick tip assembly 100, according to aspects of the present disclosure. The pick tip assembly 100 includes a pick tip body 102, a vacuum cup 104, and a gasket 106. The gasket 106 can be any type of gasket, such as an O-ring, that can be used to form an airtight seal, as discussed further below with respect to FIG. 10. The vacuum cup 104 can be any type of vacuum cup used in a conventional pick tip assembly.

Referring to the pick tip body 102 and FIG. 2, the pick tip body 102 includes a proximal portion 108 and a distal portion 110. The proximal portion 108 is configured to be inserted into a housing channel of a housing, as further discussed below with respect to FIG. 5 and FIG. 10. In one or more embodiments, the proximal portion 108 can be made of a ferromagnetic metal, such as iron, cobalt, nickel, or an alloy thereof. As a result, the proximal portion 108 of the pick tip body 102 can be attracted to a magnet.

In one or more embodiments, the proximal portion 108 of the pick tip body 102 can be made of a different material than the remainder of the pick tip body 102. For example, the proximal portion 108 can be made of the ferromagnetic metal and the remainder of the pick tip body 102 can be made of a non-ferromagnetic material, such as rubber, plastic, thermoplastic, or a non-ferromagnetic metal, such as aluminum, aluminum, brass, copper, gold, etc. The proximal portion 108 can be secured to the remainder of the pick tip body 102 by any kind of mechanical fastener, welding, adhesive, or the like.

Alternatively, in one or more embodiments, the proximal portion 108 can be magnetic, such as by being a temporary magnet, a permanent magnet, or an electromagnet. For example, the proximal portion 108 can be formed of alnico, a ferrite, neodymium, samarium—cobalt, and the like. In one or more further alternative embodiments, the entire pick tip body 102 can be magnetic—as described above with respect to the proximal portion 108—rather than just the proximal portion 108.

In one or more embodiments, the proximal portion 108 can have a generally cylindrical shape with a chamfered section 118. The chamfered section 118 can be used to circumferentially align the pick tip assembly 100 within a housing, as discussed below in greater detail with respect to FIG. 10. Alternatively, the proximal portion 108 can have other shapes. For example the proximal portion 108 can be tapered cylinder or other three-dimensional shape to help guide the pick tip assembly 100 into a housing channel of a housing.

The distal portion 110 of the pick tip body 102 is configured to extend beyond a housing (FIG. 5) when the pick tip assembly 100 is inserted into the housing. The distal portion 110 is also configured to retain the vacuum cup 104 on the pick tip body 102. The distal portion 110 can include a first annular groove 112 around which the vacuum cup 104 can couple to the pick tip body 102 for releasably coupling the vacuum cup 104 to the pick tip body 102.

The pick tip body 102 further includes a second annular groove 114 and a third annular groove 116. The second annular groove 114 includes one or more apertures 120 leading to one or more radial channels, discussed in greater detail below with respect to FIG. 4. In one or more embodiments, the gasket 106 sits within and is at least partially retained by the third annular groove 116 to releasably couple the gasket 106 to the pick tip assembly. For example, the gasket 106 can be an O-ring that partially sits within the third annular groove 116. The gasket 106 seated within the third annular groove 116 is configured to form an airtight seal with a housing when the pick tip assembly 100 is inserted into the housing, as discussed further below with respect to FIG. 10. However, in one or more embodiments, the pick tip body 102 may lack the third annular groove 116. The gasket 106 can be coupled or fixed to the pick tip body 102 via, for example, an adhesive and/or mechanical fastener.

Figure 3:
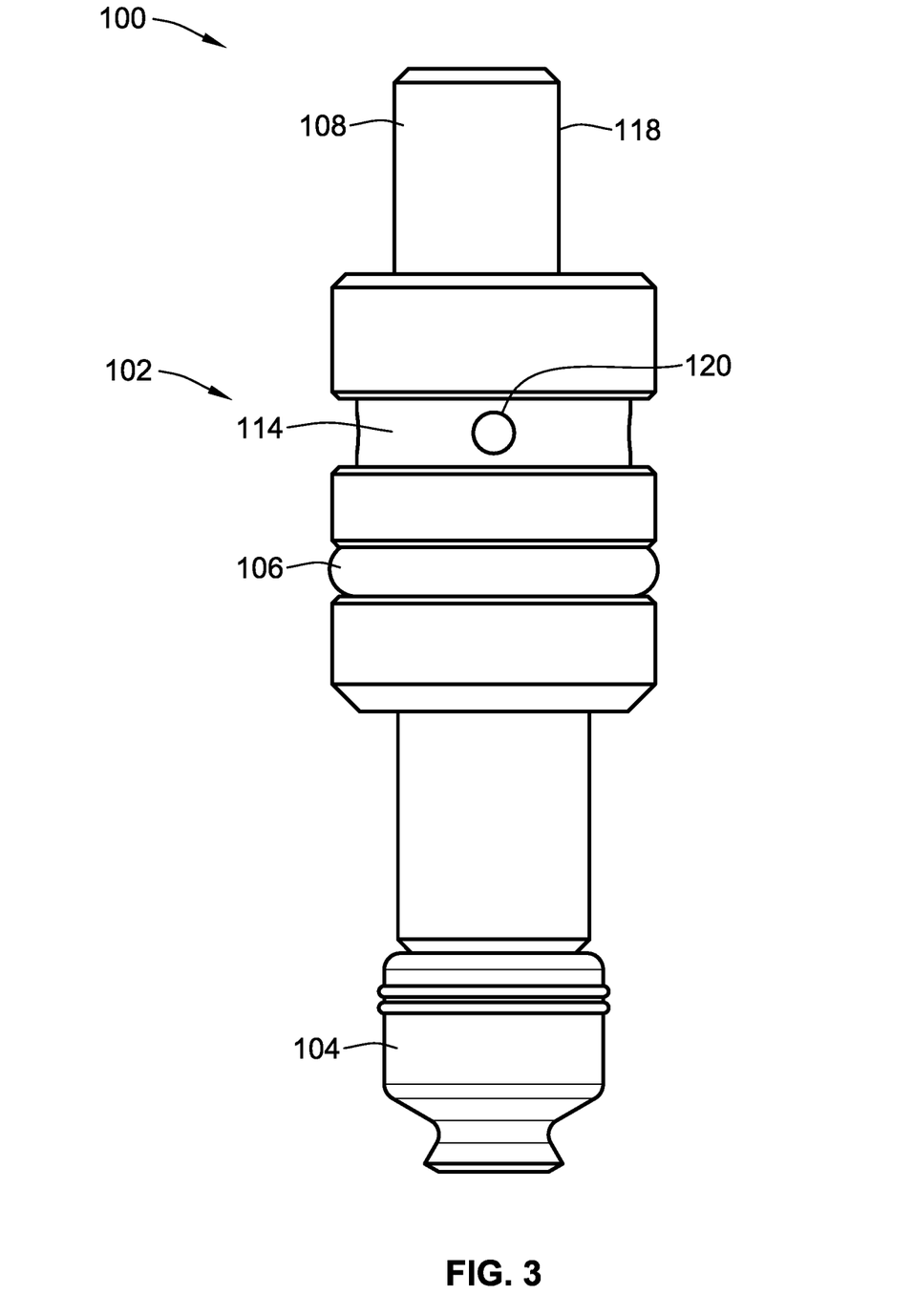
FIG. 3 is a side view of the pick tip assembly of FIG. 1, according to aspects of the present disclosure.
Figure 4:
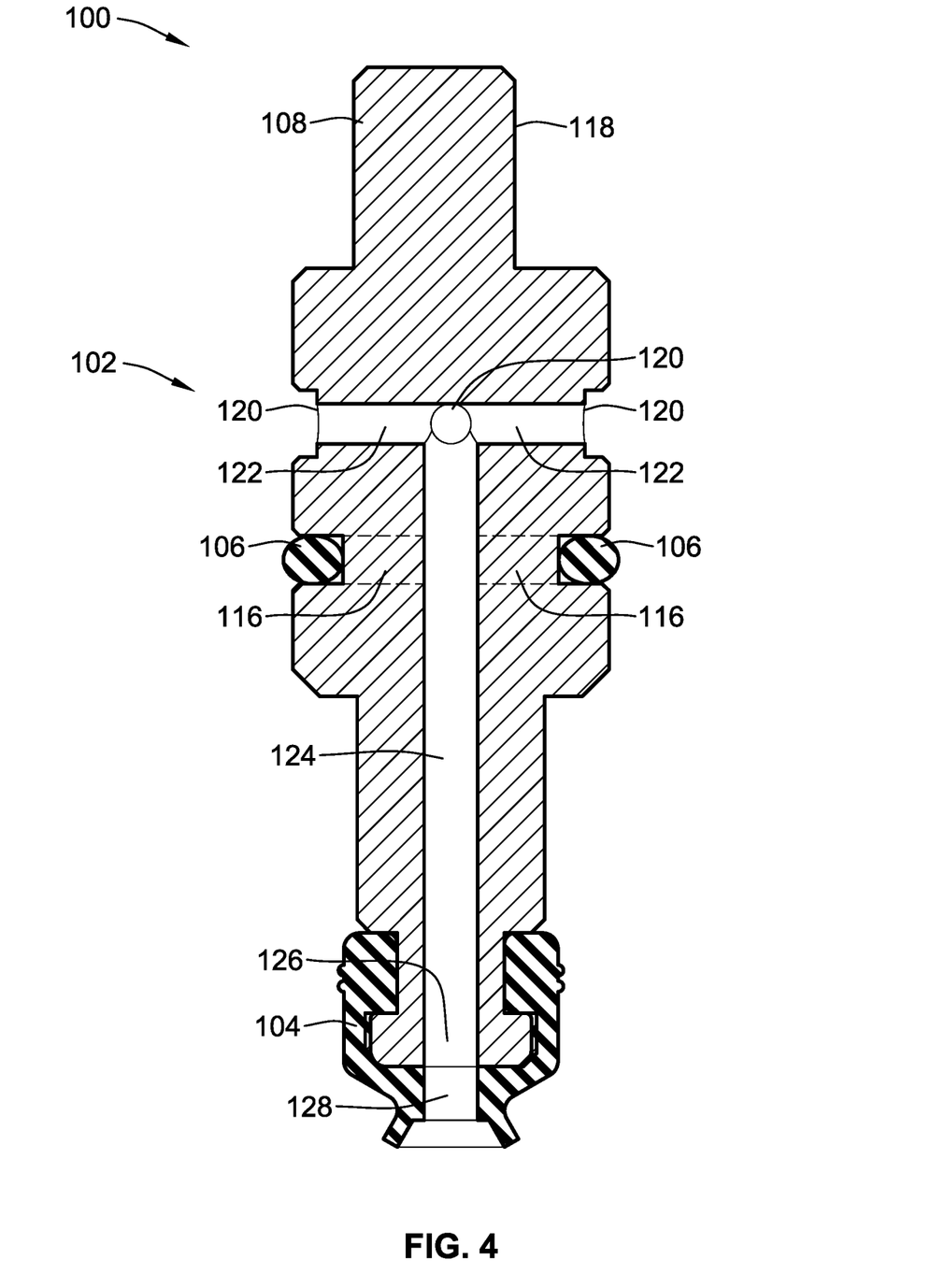
FIG. 4 is a side cross-sectional view of the pick tip assembly of FIG. 1, according to aspects of the present disclosure.

FIG. 3 is a side view of the pick tip assembly 100, and FIG. 4 is a cross-sectional view of FIG. 3, according to aspects of the present disclosure. As shown in FIG. 3, the aperture 120 opens to a radial channel 122 (FIG. 4) that extends towards the center of the pick tip body 102. Referring to FIG. 4, the cross-section of the pick tip assembly 100 reveals two additional radial channels 122 similarly extending radially away from the center of the pick tip assembly 100. A fourth radial channel 122 extends away from the center of the pick tip assembly 100 from where the radial channels intersect at the center of the pick tip body 102. Although only four radial channels 122 are disclosed, there can be fewer or more radial channels 122, such as one, two, three, five, six, seven, eight, etc. Additionally, although the radial channels 122 are disclosed as being evenly spaced apart every 90 degrees around the pick tip body 102, alternatively, the radial channels 122 can be unevenly arranged about the pick tip body 102.

The radial channels 122 extend toward the center of the pick tip body 102 and connect to a pick tip body channel 124. The pick tip body channel 124 extends longitudinally along the length of the pick tip body 102 down to and through the distal portion 110 of the pick tip body 102. The distal portion 110 includes an aperture 126 into the pick tip body channel 124. The vacuum cup 104 similarly has a vacuum cup channel 128 that communicates with the pick tip body channel 124. Thus, the apertures 120 are in fluid communication with the aperture 126 through the radial channels 122 and the pick tip body channel 124.

Figure 5:
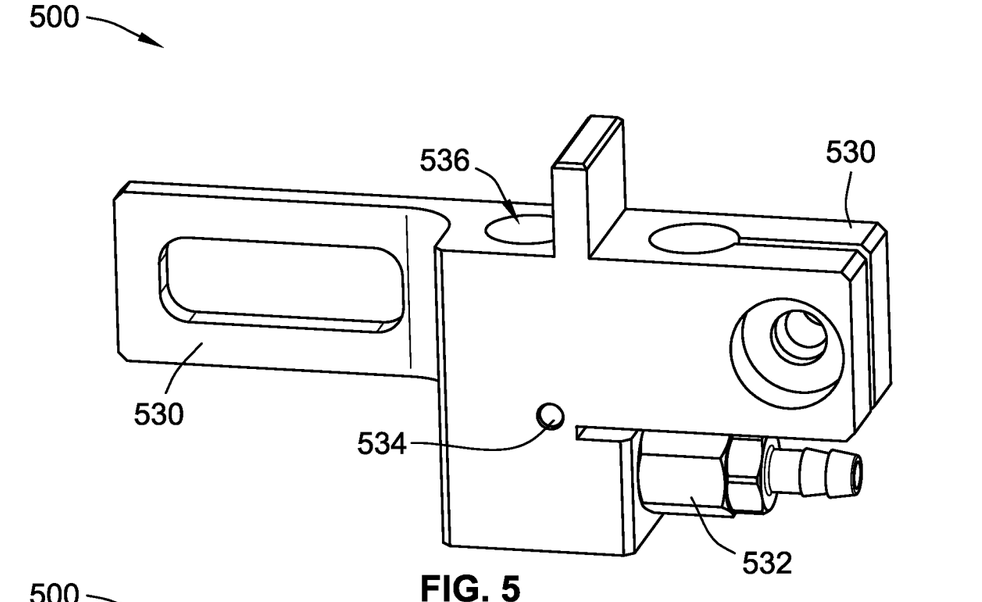
FIG. 5 is a perspective view of a housing for a pick tip assembly, according to aspects of the present disclosure.

Referring to FIG. 5, shown is a perspective view of a housing 500 for a pick tip assembly, such as the pick tip assembly 100 of FIG. 1, according to aspects of the present disclosure. The housing 500 can be made of any material that can withstand the application of a vacuum, such that the housing 500 generally maintains its shape in response to compressive forces from the environment when a vacuum is applied within the housing 500. For example, the housing 500 can be made of metal, metal alloys, plastics, thermoplastics, hard rubbers, ceramics, composites, etc.

In one or more embodiments, the housing 500 can include one or more brackets 530 for securing the housing 500 to another object, such as arm, another housing 500, and the like. The housing 500 also includes a fitting 532, such as a barbed fitting. Similar to a housing for a conventional pickup tip, the fitting 532 can be configured to accept an external vacuum source (not shown), such as a hose, a tube, a metal pipe, etc., for applying a vacuum to the housing 500, as further described below. In one or more embodiments, the housing 500 can include a member or feature 534, such as a pin, that can cooperate with another member or feature of a pick tip assembly for aligning the pick tip assembly relative to the housing 500, as further discussed below with respect to FIG. 10. For example, the feature 534 can cooperate with the chamfered section 118 for circumferentially aligning the pick tip assembly 100 with the housing 500.

Figure 6:
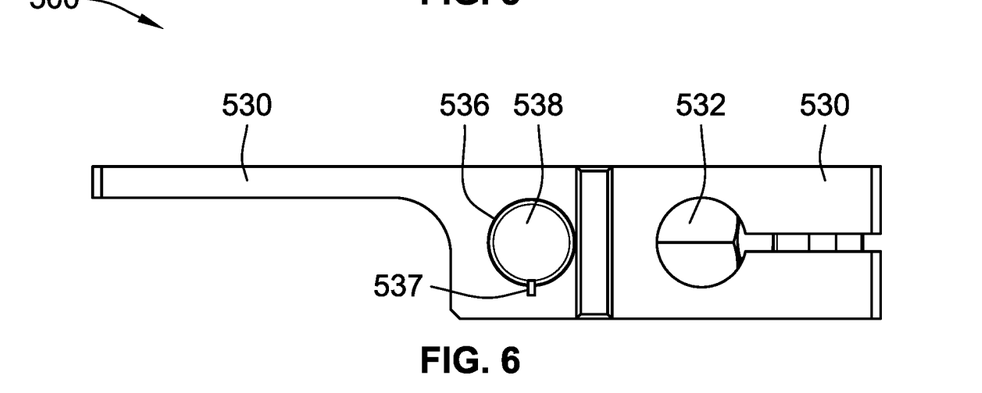
FIG. 6 is a top view of the housing of FIG. 5, according to aspects of the present disclosure.

As shown in FIG. 5, and in greater detail in FIG. 6, which is a top view of the housing 500, in one or more embodiments, the housing 500 can include a first housing channel 536. The first housing channel 536 can be configured to accept a magnet 538, such as a temporary magnet, a permanent magnet, or an electromagnet. As discussed below with respect to FIG. 10, the magnet 538 can be used for releasably holding a pick tip assembly within the housing 500, such as the pick tip assembly 100. Specifically, the magnet 538 can magnetically attract and retain the proximal portion 108 of the pick tip body 102, to retain the pick tip assembly 100 within the housing 500.

In one or more embodiments, the housing 500 can be made of a ferromagnetic material. In which case, the magnetic attraction between the magnet 538 and the metallic housing 500 can assist in retaining the magnet 538 within the first housing channel 536. Alternatively, or additionally, the magnet 538 can be retained within the housing 500 via a fastener, such as an adhesive, a sealant, a mechanical fastener, or the like. For example, FIG. 6 shows a set screw 537 assisting in retaining the magnet 538 within the housing 500.

As discussed above, the proximal portion 108 of the pick tip assembly 100 can be a magnet, such as a permanent magnet. In which case, the magnet 538 can be omitted from the housing 500. However, in such a case, the housing 500 must be formed of a ferromagnetic material so that the magnet as the proximal portion 108 of the pick tip assembly 100 can be magnetically attracted to the housing 500.

Figure 7:
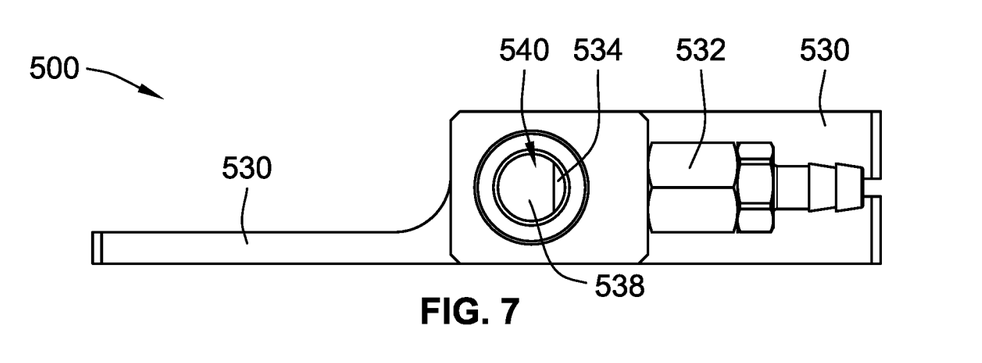
FIG. 7 is a bottom view of the housing of FIG. 5, according to aspects of the present disclosure.

FIG. 7 is a bottom view of the housing 500 of FIG. 5, according to aspects of the present disclosure. The housing 500 includes a second housing channel 540. The second housing channel 540 is configured to accept a pick tip assembly, as further discussed below with respect to FIG. 10. The second housing channel 540 is further connected to the fitting 532 such that the vacuum applied from the external vacuum source (not shown) can be applied to the second housing channel 540.

At the top of the second housing channel 540 is the magnet 538. Initially, the first housing channel 536 and the second housing channel 540 can be a single channel through the housing 500 that effectively becomes divided into two channels by the placement of the magnet 538 in the first housing channel 536. Alternatively, the first housing channel 536 and the second housing channel 540 can instead be two separate channels that do not touch or pass entirely through the housing 500. A portion of the housing 500 can divide the first housing channel 536 and the second housing channel 540.

Figure 8:
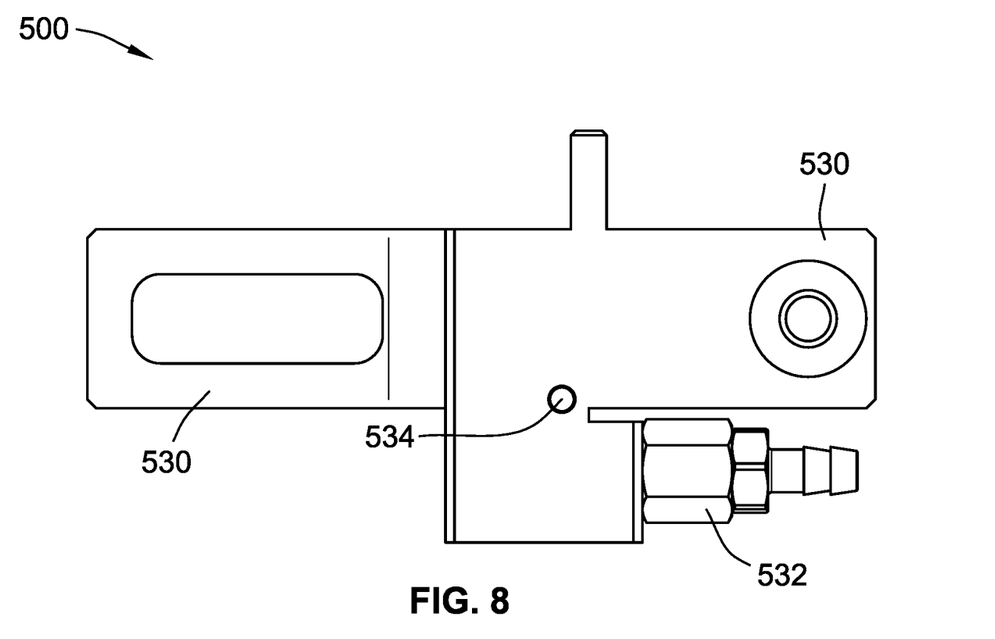
FIG. 8 is a side view of the housing of FIG. 5, according to aspects of the present disclosure.
Figure 9:
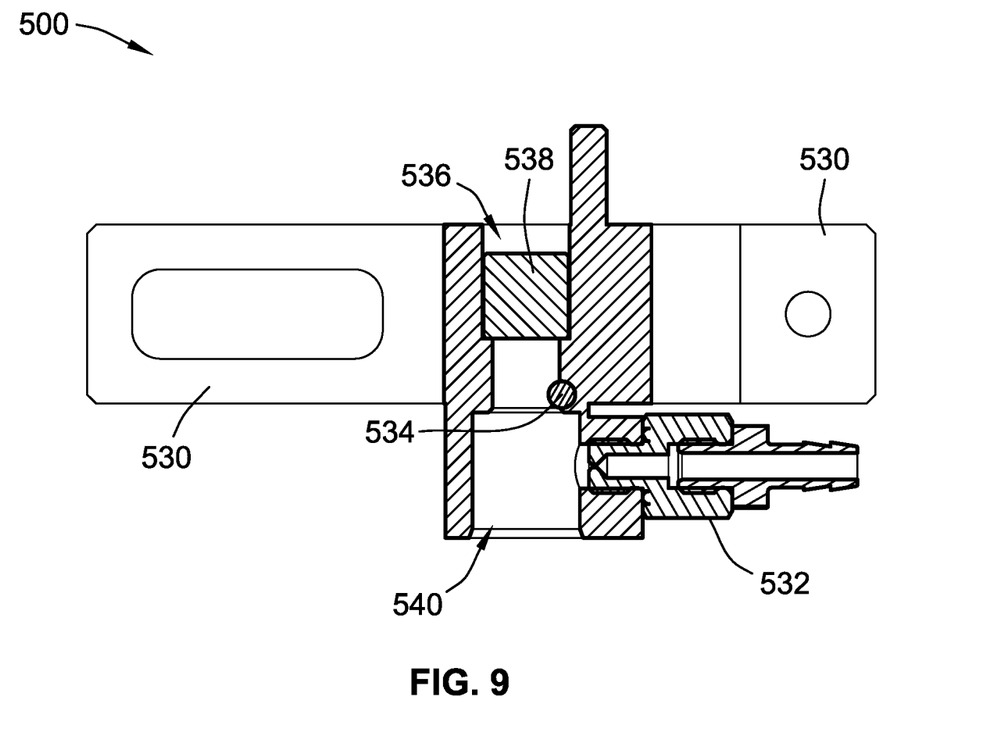
FIG. 9 is a cross-sectional side view of the housing of FIG. 5, according to aspects of the present disclosure.

FIG. 8 is a side view of the housing 500, and FIG. 9 is a cross-sectional side view of FIG. 8, according to aspects of the present disclosure. As shown, the fitting 532 is in communication with the second housing channel 540 to apply the vacuum from an external vacuum source (not shown) to the second housing channel 540.

Figure 10:
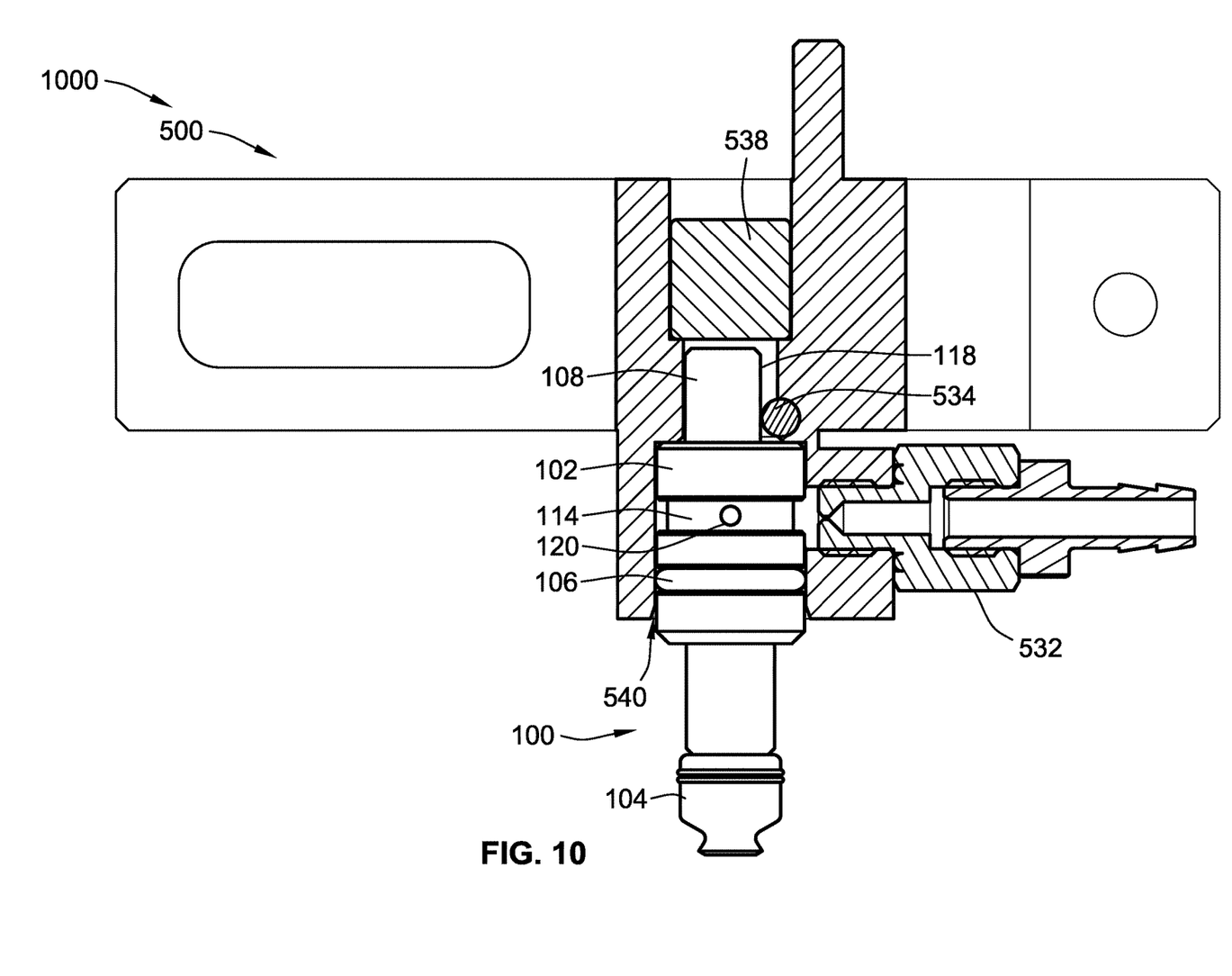
FIG. 10 is a cross-sectional side view of the pick tip assembly of FIG. 1 within the housing of FIG. 5, according to aspects of the present disclosure.

FIG. 10 is a partial cross-sectional side view of a pick tip apparatus 1000, according to aspects of the present disclosure. The pick tip apparatus 1000 includes the pick tip assembly 100 inserted into the second housing channel 540 of the housing 500, shown in cross-section. The gasket 106 of the pick tip assembly 100 and the second housing channel 540 of the housing 500 are configured to form an airtight seal when the pick tip assembly 100 is inserted into the second housing channel 540. The airtight seal can be based on the interference fit between the gasket 106 and the second housing channel 540.

The vacuum applied by the external vacuum source (not shown) connected to the fitting 532 is transferred to the pick tip body channel 124 by the fitting 532 aligning with the second annular groove 114 in the pick tip body 102, which further aligns with the apertures 120 of the radial channels 122. Accordingly, the vacuum from the external vacuum source can be applied to the vacuum cup 104, via the pick tip body channel 124, allowing the vacuum cup 104 to selectively pick up and put down various components by selectively applying the vacuum.

Further, there is a magnetic attraction between the pick tip assembly 100 and the housing 500 that retains the pick tip assembly 100 within the housing 500, the specifics of which can vary depending on the arrangement of the magnet and the ferromagnetic portion, as described above. For example, the proximal portion 108 of the pick tip body 102 can be ferromagnetic and the magnet 538 in the housing 500 can retain the pick tip assembly 100 in the second housing channel 540 based on the strength of the magnetic attraction. Alternatively, the proximal portion 108 can be a magnet and the housing 500 can be made of a ferromagnetic material. The magnetic attraction between these two components can be sufficiently strong for retaining the pick tip assembly 100 in the second housing channel 540, even when the vacuum cup 104 is used to selectively pick up objects.

Based on the arrangement illustrated in FIG. 10, the pick tip assembly 100 can be removed from the housing 500 without requiring a tool. For example, a mechanical force can be applied to the pick tip assembly 100 for overcoming the magnetic attraction holding the pick tip assembly 100 within the second housing channel 540 of the housing 500. Specifically, the mechanical force can be greater than the magnetic attraction between the ferromagnetic proximal portion 108 and the magnet 538. In one or more embodiments, the mechanical force can further overcome the interference fit between the gasket 106 of the pick tip assembly 100 and the second housing channel 540.

After the magnetic attraction is overcome, the pick tip assembly 100 can simply be withdrawn from the second housing channel 540.

Thereafter, a different pick tip assembly, similarly configured to the pick tip assembly 100, but with perhaps a different vacuum cup or length of pick tip body, can be inserted into the second housing channel 540. Inserting the different pick tip assembly merely requires applying a mechanical force to the different pick tip assembly to overcome any interference fit between a gasket of the different pick tip assembly and the second housing channel 540.

Securing the different pick tip assembly to the housing 500 simply requires releasing a second mechanical force on the different pick tip assembly, once the different pick tip assembly is within the housing 500, for allowing the magnetic attraction to hold the different pick tip assembly within the second housing channel 540. In one or more embodiments, a third mechanical force can be applied to the second pick tip assembly for overcoming an interference fit between a second gasket of the second pick tip assembly and the second housing channel 540 when inserting the second pick tip assembly into the housing channel. In one or more embodiments, the strength of the magnetic attraction holding the different pick tip assembly (or any pick tip assembly 100) within the second housing channel 540 can be strong enough to overcome any interference fit between the gasket of the different pick tip assembly and the second housing channel 540. This allows the magnetic attraction to fully seat the different pick tip assembly within the second housing channel 540. Thus, a user may not even need to fully seat a pick tip assembly within the second housing channel 540.

The magnetic attraction between the pick tip assembly and the housing 500 can be sufficient to fully seat the pick tip assembly.

The tolerances for forming the second housing channel 540 and the pick tip assembly 100 can be configured such that merely putting and retaining the pick tip assembly 100 within the second housing channel 540 properly aligns the pick tip assembly 100 in the X, Y, and X directions such that no tool is required for proper alignment. Moreover, in one or more embodiments, the feature 534 within the housing 500, such as the illustrated pin, can cooperate with the chamfered section 118 of the proximal portion 108 of the pick tip body 102 to circumferentially align the pick tip assembly 100 with the housing 500. The circumferential alignment may be to, for example, align the apertures 120 with the fitting 532.

Figure 11:
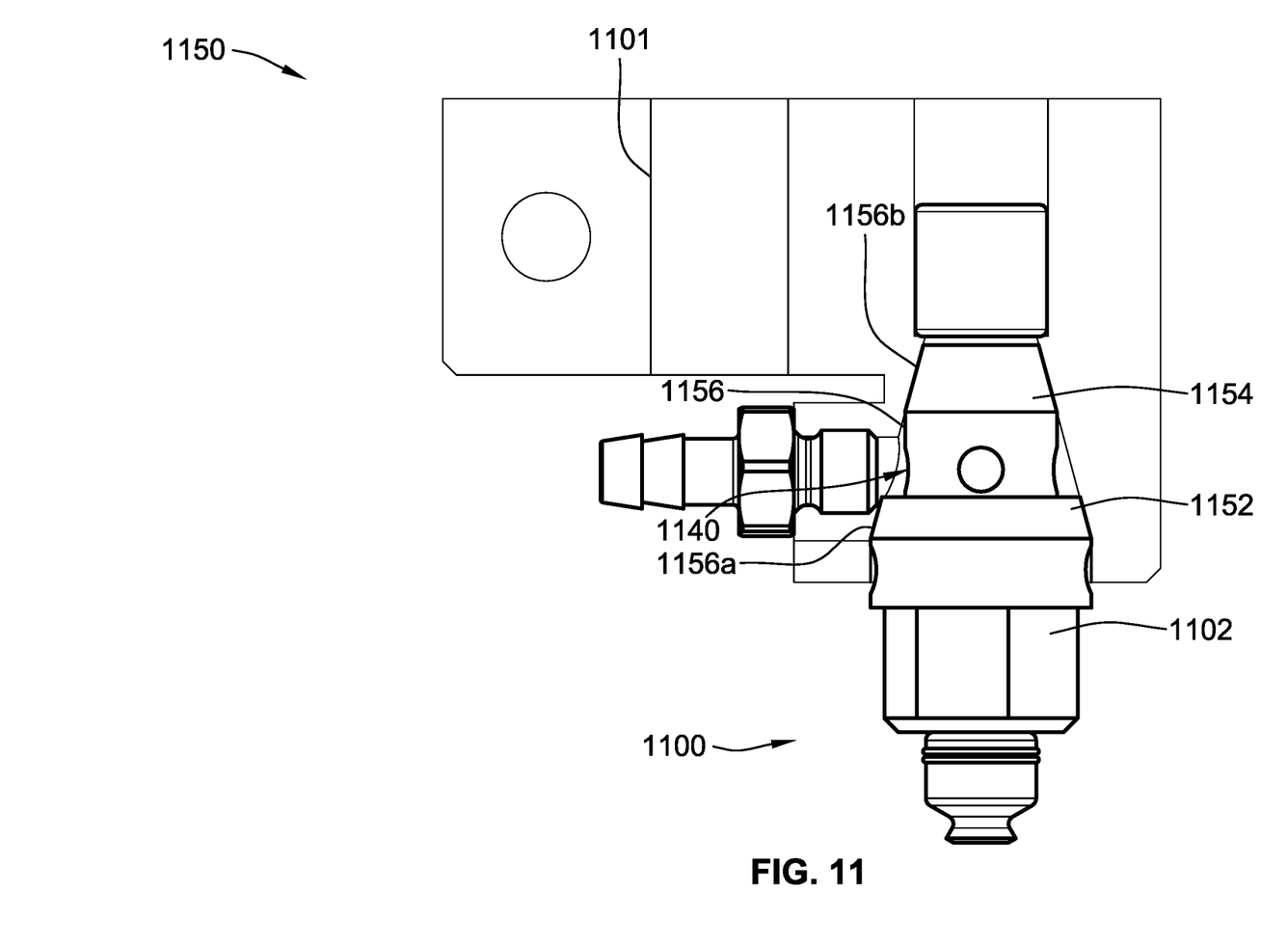
FIG. 11 is a cross-sectional side view of an alternative pick tip assembly within an alternative housing, according to aspects of the present disclosure.

FIG. 11 is a cross-sectional side view of an alternative pick tip apparatus 1150, according to aspects of the present disclosure. More specifically, illustrated is a cross-sectional side view of an alternative housing 1101 with an alternative pick tip assembly 1100, according to aspects of the present disclosure. The pick tip assembly 1100 and the housing 1101 are substantially identical to the pick tip assembly 100 and the housing 500 disclosed above, except for the following differences.

Namely, the pick tip assembly 1100 includes a pick tip body 1102 that includes a first beveled surface 1152 and, optionally, a second beveled surface 1154. The housing 1101 includes a second housing channel 1140 with an angled or beveled surface 1156 that narrows the farther into the housing 1101. The angle of the first beveled surface 1152 and the optional second beveled surface 1154 cooperatively match the angle of the corresponding portions 1156a and 1156b, respectively of the first beveled surface 1152 of the second housing channel 1140, where the first beveled surface 1152 and the optional second beveled surface 1154 align with the second housing channel 1140 when the pick tip assembly 1100 is inserted into the housing 1101. As a result, the first beveled surface 1152 and optional second beveled surface 1154 can form airtight seals with the corresponding portions 1156a and 1156b of the second housing channel 1140 without the need of, for example, a gasket. In one or more embodiments that lack the optional second beveled surface 1154, the second housing channel 1140 can include only the corresponding portion 1156a of the beveled surface 1156. The remainder of the second housing channel 1140 can take various shapes, such as cylindrical.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms should be interpreted as having a meaning that is consistent with their meaning in the context of the relevant art and will not be interpreted in an idealized or overly formal sense unless expressly so defined herein.

What is claimed is:

1. A pick tip assembly configured to be releasably held within a housing channel of housing by a magnet, the pick tip assembly comprising:
   a vacuum cup; and
   a pick tip body having a pick tip body channel in communication with the housing channel and configured to apply a vacuum from the housing channel to the vacuum cup, the pick tip body including one or more radial channels configured to connect the housing channel to the pick tip body channel, and the pick tip body further including a first annular groove,
   wherein the one or more radial channels extend out radially out from the pick tip body channel towards the first annular groove.

2. The pick tip assembly of claim 1, wherein the pick tip body includes a proximal portion configured to be inserted into the housing and a distal portion configured to extend beyond the housing when the pick tip assembly is inserted into the housing.

3. The pick tip assembly of claim 2, wherein the vacuum cup is coupled to the pick tip body at the distal portion.

4. The pick tip assembly of claim 2, wherein the proximal portion of the pick tip body is ferromagnetic.

5. The pick tip assembly of claim 2, wherein only the proximal portion of the pick tip body is ferromagnetic.

6. The pick tip assembly of claim 1, wherein the vacuum cup is configured to be removable from the pick tip body.

7. The pick tip assembly of claim 1, wherein the pick tip body includes a first feature configured to cooperate with a second feature of the housing when the pick tip assembly is seated within the housing channel to circumferentially align the pick tip assembly with the housing.

8. A pick tip assembly configured to be releasably held within a housing channel of housing by a magnet, the pick tip assembly comprising:
   a vacuum cup; and
   a pick tip body having a pick tip body channel in communication with the housing channel and configured to apply a vacuum from the housing channel to the vacuum cup, the pick tip body including a proximal portion configured to be inserted into the housing and a distal portion configured to extend beyond the housing when the pick tip assembly is inserted into the housing,
   wherein only the proximal portion of the pick tip body is ferromagnetic.

9. The pick tip assembly of claim 8, wherein the pick tip assembly is fixed to the magnet to releasably couple to a ferromagnetic material of the housing.

10. The pick tip assembly of claim 8, wherein the pick tip body includes one or more radial channels configured to connect the housing channel to the pick tip body channel.

11. The pick tip assembly of claim 8, wherein the pick tip assembly includes a gasket around a portion of the pick tip body, the gasket being configured to form an airtight seal with the housing when the pick tip assembly is inserted into the housing channel.

12. The pick tip assembly of claim 11, wherein the portion of the pick tip body includes an annular groove, and the gasket sits at least partially within the annular groove.

13. The pick tip assembly of claim 8, wherein the pick tip body includes a first beveled surface configured to cooperate with a second beveled surface of the housing to form an airtight seal when the pick tip assembly is seated within the housing channel.

* * * * *